March 2, 1971 G. G. BURLINGAME 3,567,593

PROCESS OF ETCHING AND ELECTROPLATING PRINTED CIRCUITS

Filed Sept. 17, 1968

INVENTOR
GEORGE G. BURLINGAME

BY Stephen & Jacobson

ATTORNEYS 3,567,593

PROCESS OF ETCHING AND ELECTROPLATING PRINTED CIRCUITS

George G. Burlingame, Stillwater, Minn., assignor to Buckbee-Mears Company, St. Paul, Minn.

Filed Sept. 17, 1968, Ser. No. 760,339
Int. Cl. B29c 17/08; C23b 5/48
U.S. Cl. 204—15 3 Claims

ABSTRACT OF THE DISCLOSURE

A process of etching and electroplating a printed circuit having a recessed region utilizing the same resist material to control the etching and the electroplating.

BACKGROUND OF THE INVENTION

Field of the invention

This invention relates generally to the art of producing printed circuits and, more specifically, to printed circuits having a recessed electroformed region.

Description of the prior art

Improvements are continuously being made in materials and methods for producing printed circuits, and particularly, in the production of miniaturized precision circuits. The basic, well-known steps have remained the same but various techniques have been developed for producing these printed circuits. The present invention is concerned with producing printed circuits having a recessed electroformed region. The usual and well known manner to produce a printed circuit of this type involves several steps. Basically, a sheet of material such as stainless steel is covered with a circuit defining mask and then etched with a suitable etchant that does not react with the masking material. Although stainless steel is described it is apparent other materials could be used and no limitation is intended thereto. The stainless steel that remains constitutes the desired circuit pattern. A prior art method for making a printed circuit with a recessed region involved placing a photoresistant material in register on both sides of the sheet of material. Then one etches part way on one side. Next one removes a portion of the photoresistant material on one side and etches from both sides. This technique involves at least two steps in the etching process in addition to placing the circuit defining pattern in register on both sides of the sheet of material.

In addition, the recessed region on these printed circuits are usually required to be plated with expensive plating material such as gold. In order to save on the cost of the plating material, it is necessary to put a second enamel or photoresistive material on the partially etched out circuit to cover the areas that are not going to be electroplated. Obviously this is time consuming and negates a portion of the savings in using gold on selective areas thus adding to the cost of the process of manufacturing a recessed printed circuit having a recessed plated region. Still another method involved plating the entire sheet of material and then masking and etching with at least two different etchants. Obviously this utilizes more plating because a portion of the plating is etched out. If expensive plating such as gold is used this is obviously costly and undesirable.

SUMMARY

Briefly, I have invented a process for manufacturing a printed circuit with a recessed plated region that involves a minimum number of steps by utilizing a pattern on only one side while etching on both sides of the material and then electroplating on the material prior to removing the photoresistive material from the sheet of material so as to save on the depositant used as well as eliminating masking off the material a second time.

Initially, a sheet of metallic material 10 such as copper or stainless steel is coated on both sides with a layer of photosensitive resist material 11 and 12. Various types of suitable resist materials are well known in the art and are commonly available. Also, the manner of coating the material with resist does not constitute a part of this invention and likewise is well known and will not be described here in any detail. A suitable resist material may be applied in the manner as described in Pats. 2,786,443 and 2,791,514 issued to N. B. Mears. Typically the resist, in liquid form, flows down both sides of the vertically orientated sheet of material. The resists could also be applied by rolling, brushing, spraying, etc. The resist coated sheet is then placed in an oven or drying chamber where it is subjected to controlled temperature and atmosphere conditions to dry or harden the resist. This may be done in any convenient manner, for example, as briefly described in N. B. Mears Pat. 2,710,591.

Figure 1:
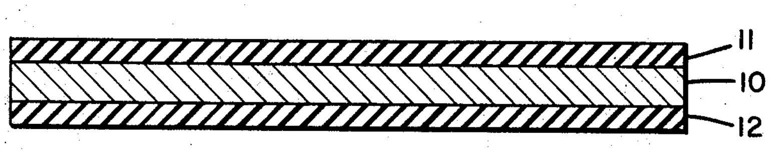
FIGS. 1 to 5 illustrate the condition of the article being etched and plated an the various steps of the inventive process.
Figure 2:
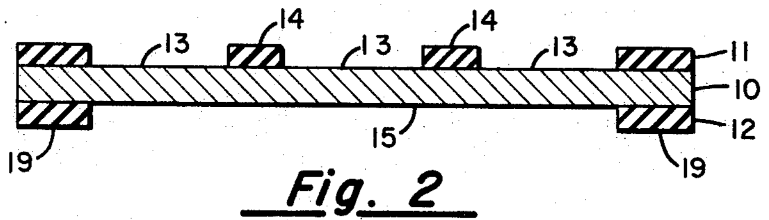

In the next step of the process a circuit pattern is photoprinted onto the light sensitive resist coating on one side only and on the opposite side of the sheet there is produced an open area 15 between support areas 19. Typically, this is done by projecting light from a suitable actinic light source onto the resist coating through master photographic plates which are carried by vacuum frames and which hold the plates in contact with the coated surface such as described in Mears Pat. 2,814,975. By using suitable well known developing and washing techniques, one produces voids 13 and open areas 15 (FIG. 2) in the resist coatings 11 and 12. The exposed material 10 in these voids and open areas can be readily etched while material 10 covered with resist cannot. Next, material 10 may be subjected to further drying out or baking to harden the remaining resist to protect it against any harm during subsequent etching. Also, if the material is to be stored for any period of time before further processing, this additional drying is advisable.

Figure 3:
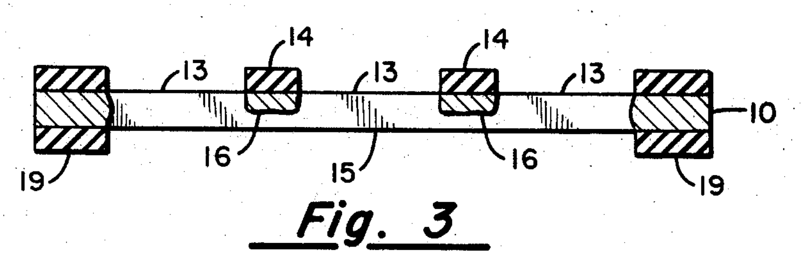

In the next step of the process a suitable etchant is applied to both sides of sheet material 10 with the result that the etchant attacks material 10 in those areas corresponding to voids 13 and open area 15 which are not protected by resist 11 and 12. Typically, the etchant can be applied in any number of ways. A typical example is shown and described in the N. B. Mears Pat. 2,762,149 and 2,822,635. In the present process the etchant is applied to both sides of the material allowing the etchant to etch completely through the material in the areas which are not protected by the resist material on either side of the material 10. On those areas denoted by reference numeral 14 (FIG. 3) that are protected on only one side by resist material, sheet material 10 is etched only half way through from the underside as shown in FIG. 3. This produces a circuit pattern which has a recessed region 16 on one side and a flat surface on the opposite side where material 10 is covered by resist material 11. Following the etching process the circuit with the recessed region is next plated with suitable electroplating in areas which are not covered by the resist material 11 and 12.

Figure 4:
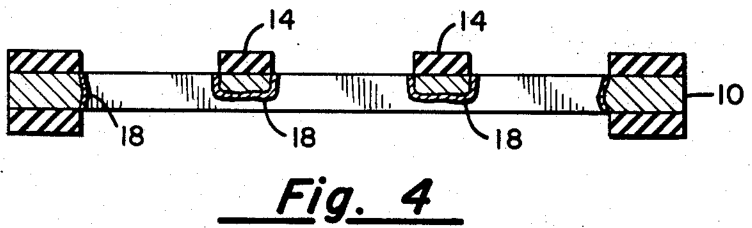

Typically, a depositant such as gold or nickel is plated onto material 10 (FIG. 4). By retaining etchant resist material 11 and 12 on etched material 10 during electroplating, only the recessed region of the circuit is plated. This particular technique in electroplating while the etch resistant material is still on the sheet material reduces the amount of electroplating material required to plate the printed circuit. Furthermore, an additional advantage realized is that a second application of resist material is not necessary nor does the resist material have to be removed before the plating process takes place.

Figure 5:

After the material has been plated the resist material 11 and 12 is removed from the sheet of material 10 thus producing a circuit having the appearance which is shown in cross-section in FIG. 5.

Thus, a printed circuit having a recessed plated region has been produced in a minimum amount of time, in a minimum number of steps and with a minimum amount of depositant material.

Although the invention has been described as using the well known mode of printing and developing techniques to form the desired pattern in a resist coating 11, no limitation was intended thereto. The protecting mask which defines the desired circuit pattern could be printed or otherwise formed directly on the material sheet 10 and then baked on at elevated temperatures before being etched.

I claim:

1. A process for making printed circuits with a recessed region on one side, comprising the steps of:

(a) forming a circuit defining pattern on one side of a sheet of material with etchant resist;

(b) forming only a support area onto the opposite side of said sheet of material with etchant resist;

(c) etching areas of said material not covered by etchant resist completely through simultaneously from both sides;

(d) electroplating on said opposite side of said sheet of material in areas not covered by etchant resist; and (e) removing the etchant resist from said sheet of material.

2. The process of claim 1 wherein a layer of gold is electroplated on said sheet of material.

3. The process of claim 1 wherein said etchant resist is baked on etchant resist.

References Cited

UNITED STATES PATENTS

| | | | |
|---|---|---|---|
| 2,217,334 | 10/1940 | Diggory et al. | 204—15 |
| 2,397,285 | 3/1946 | Murray | 156—8 |
| 2,762,149 | 9/1956 | Mears | 156—8 |
| 2,978,389 | 4/1961 | Turnbull | 204—24 |
| 3,423,261 | 1/1969 | Frantzen | 156—11 |

FOREIGN PATENTS

| | | |
|---|---|---|
| 1,122,635 | 1/1962 | Germany. |

TA-HSUNG TUNG, Primary Examiner

T. TUFARIELLO, Assistant Examiner

U.S. Cl. X.R.

204—24; 156—11